(12) United States Patent
Schorn

(10) Patent No.: US 6,278,334 B1
(45) Date of Patent: Aug. 21, 2001

(54) VOLTAGE CONTROLLED OSCILLATOR WITH ACCELERATING AND DECELERATING CIRCUITS

(75) Inventor: Eric Bernard Schorn, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 09/449,863

(22) Filed: Nov. 29, 1999

(51) Int. Cl.[7] .................................................. H03B 5/24
(52) U.S. Cl. ........................ 331/57; 331/46; 331/74; 327/263; 327/264
(58) Field of Search .................... 331/57, 74, 46, 331/47, 48, 50; 327/263, 264

(56) References Cited

U.S. PATENT DOCUMENTS 6,100,768 * 8/2000 Hirayama .............................. 331/57

* cited by examiner

Primary Examiner—Arnold Kinkead
(74) Attorney, Agent, or Firm—Nixon & Vanderhye P.C.

(57) ABSTRACT

A voltage controlled oscillator is provided in the form of two ring oscillators 30 and 32. Each oscillator stage 14 includes an invertor 16, a level change accelerating circuit 18 and a level change decelerating circuit 20. The level change accelerating circuit 18 is responsive to an input control signal Vctrl to increase the oscillator frequency by decreasing the propagation delay through the invertor 16. The level change decelerating circuit 20 is responsive to the input control signal Vctrl to decrease the oscillator frequency by increasing the propagation delay through the invertor 16. Pairs of opposing invertors 34, 36, 38, 40 and 42 disposed between output signal lines of corresponding oscillator stages 14 in the two ring oscillators 30 and 32 serve to lock the two ring oscillators in antiphase.

15 Claims, 5 Drawing Sheets

VOLTAGE CONTROLLED OSCILLATOR WITH ACCELERATING AND DECELERATING CIRCUITS

BACKGROUND OF THE INVENTION

1. Field of the Invention

This invention relates to the field of voltage controlled oscillators. More particularly, but not exclusively, this invention relates to voltage controlled oscillators of a type suitable for use in generating clock signals used to drive digital circuits.

2. Description of the Prior Art

As digital integrated circuits scale down in size and increase in speed it becomes increasingly difficult to provide noise and jitter free clock signals. Phase locked loop systems including voltage controlled oscillators are often used in the synthesis of clock signals in digital systems. Voltage controlled oscillators generate an output signal with a frequency that is dependent upon an input control signal. The input control signal is a particularly sensitive node within the system as it is typically left floating for a large proportion of the time and so small noise voltages can produce large frequency shifts, e.g. a one Volt change in the input control voltage might produce a 100 MHz change in the oscillator output signal frequency. The input control signal may be either single ended or differential.

Differential control voltage systems are more complex to design and fine tune than single ended systems. Differential systems also tend to consume more power due to the additional and larger circuitry they contain and have more failure mechanisms. However, differential systems typically have a greater input control signal range than single ended system and this can be an advantage as a given frequency range of the voltage controlled oscillator can be provided using a wider input control signal range so making the oscillator output less prone to noise on the input control signal. An example of a complex differential phase locked loop system can be found in ISSCC Digest of Technical Papers, February 1995, page 112.

Single ended control voltage systems are generally more popular than differential systems due to their simplicity and proven performance. Typically the input control voltage is supplied to the gate of a single FET (the gate connection allows the voltage to float as is needed) which acts as a voltage to current converter. The resulting current then acts to control a current controlled oscillator. A problem with such systems is that the voltage-to-current FET conducts substantially zero current until the input control signal passes a threshold level and at the other end of the voltage range saturation effects degrade the linear response. This limits the control voltage range, particularly as long channel FETs are used that tend to have higher threshold voltages. Examples of single ended voltage controlled oscillators can be found in the IEEE Journal of Solid State Circuits November 1998, page 1636; October 1997, page 1516; April 1997, page 584; April 1995, page 383 and November 1992, page 1599.

The problem of a reduced control voltage range due to threshold voltage effects can also occur differential systems. The threshold voltage problem is made worse by reducing the operating voltage of the oscillator in an effort to reduce power consumption a since the input control signal range lies between the substantially fixed threshold voltage and the reduced operating voltage level.

The present invention has the object of addressing the above described problems.

SUMMARY OF THE INVENTION

Viewed from one aspect the present invention provides a voltage controlled oscillator for generating an oscillator output signal with an oscillator output frequency controlled by an input control signal, said voltage controlled oscillator comprising:

a ring oscillator circuit having a plurality of oscillator stages linked in a ring with each oscillator stage generating a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage; wherein at least one of said oscillator stages includes:

(i) a signal level change accelerating circuit that acts to decrease said propagation delay time and increase said oscillator output frequency in response to a first change in said input control signal; and (ii) a signal level change decelerating circuit that acts to increase said propagation delay time and decrease said oscillator output frequency in response a second change in said input control signal, said first change and said second change being respective different ones of an increase in said input control voltage and a decrease in said input control signal.

Providing both a signal level change accelerating circuit and a signal level change decelerating circuit for altering the propagation delay time of the oscillator stage has the advantage that whilst a first of these signal level change circuits may be inactive due to a threshold level effect the second will be active in changing the oscillator output frequency and similarly at the other end of the input control signal range when the second is inactive in further changing the oscillator output frequency, the first will still produce a change in the oscillator output frequency when the input control signal is changed. Thus, the wider span of input control signal effectiveness in changing the oscillator output frequency results in that for a given range of oscillator output frequency the system will be less sensitive to a given amount of noise on the input control signal.

Whilst the oscillator stages could have various different forms, a compact circuit is provided in embodiments in which said at least one of said oscillator stages includes an invertor that generates said stage output signal by inverting said stage output signal of said preceding oscillator stage.

The first signal level and the second signal level between which the oscillator output signal swings could have various values. However, in preferred embodiments of the invention a first rail voltage signal having a first rail voltage signal level and a second rail voltage signal having a second rail voltage signal level are supplied to said voltage controlled oscillator, said first signal level and said second signal level being equal to respective ones of said first rail voltage signal level and said second rail voltage signal level.

Providing that the oscillator stage output signal swings between the full rail voltages has the advantage of further reducing the noise sensitivity of the system.

Whilst the signal level change accelerating circuit could take various different forms an advantageously compact and robust system is provided in embodiments in which said at least one oscillator stage drives said stage output signal to change from said first signal level to said second signal level, said signal level change accelerating circuit acts to accelerate said change, to a degree controlled by said input control voltage, by driving said stage output signal in a manner supporting said change from said first signal level to said second signal level.

Whilst the signal level change decelerating circuit could take various different forms an advantageously compact and robust system is provided in embodiments in which said at least one oscillator stage drives said stage output signal to change from said first signal level to said second signal level, said signal level change decelerating circuit acts to decelerate said change, to a degree controlled by said input control signal, by driving said stage output signal of said preceding oscillator stage in said ring in a manner opposing said change from said first signal level to said second signal level.

In particularly preferred compact embodiments said level change accelerating circuit comprises a first stack of gates having a first gate controlled by said stage output signal of said preceding oscillator stage in said ring and a second gate controlled by said input control signal.

In particularly preferred compact embodiments said level change decelerating circuit comprises a second stack of gates having a third gate controlled by said stage output signal and a second gate controlled by said input control signal.

Whilst it is possible to provide embodiments in which not all of the oscillator stages within the ring oscillator include the accelerating and decelerating circuits, the oscillator output signal frequency range for a given range of input control signal values is increased in embodiments in which each of said oscillator stages includes a respective signal level change accelerating circuit and a respective signal level change decelerating circuit.

The stability and resistance to noise of the system is further improved in embodiments including two ring oscillators operating in a fixed phase relationship.

The two ring oscillators may be coupled together in a way that reduces noise and jitter effects in preferred embodiments by providing that a change in stage output signal of at least one oscillator stage of a first of said two ring oscillators is synchronised with a change in stage output signal of an oscillator stage of a second of said two ring oscillators by an parallel pair of opposing invertors coupling said stage output signal of said at least one oscillator stage of said first of said two ring oscillators to said stage output signal of said oscillator stage of said second of said two ring oscillators.

The improvements in the system performance due to the synchronisation between the two ring oscillators can be increased by providing that said two ring oscillators have an equal number of oscillator stages and each stage output signal of an oscillator stage of said first ring oscillator is coupled to a stage output signal of an oscillator stage at a corresponding position with said second ring oscillator.

The matching of the components in the different parts of the system can be improved in embodiments in which said voltage controlled oscillator is formed as an integrated circuit with corresponding stages of said two ring oscillators being formed one or more of adjacent to each other within said integrated circuit and interleaved with each other within said integrated circuit.

Improved common mode noise rejection on the input control signal can be achieved in embodiments in which said level change accelerating circuit comprises a third stack of gates having a fifth gate controlled by said stage output signal of said preceding oscillator stage in said ring and a sixth gate controlled by a logical inversion of said input control signal.

Similarly, noise reject is further improved in embodiments in which said level change decelerating circuit comprises a fourth stack of gates having a seventh gate controlled by said stage output signal and an eigth gate controlled by a logical inversion of said input control signal.

Viewed from another aspect the invention provides a method of generating an oscillator output signal with an oscillator output frequency controlled by an input control signal using a voltage controlled oscillator, said method comprising the steps of:

generating, with each stage oscillator of a ring oscillator circuit having a plurality of oscillator stages linked in a ring, a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage;

decreasing said propagation delay time and so increasing said oscillator output frequency in response to a first change in said input control voltage signal using a signal level change accelerating circuit within at least one of said oscillator stages; and increasing said propagation delay time and so decreasing said oscillator output frequency in response to a second change in said input control voltage signal using a signal level change decelerating circuit within said at least one of said oscillator stages, said first change and said second change being respective different ones of an increase in said input control voltage and a decrease in said input control voltage.

BRIEF DESCRIPTION OF THE DRAWINGS

The present invention will be described, further by way of example only, with reference to preferred embodiments thereof as illustrated in the accompanying drawings, in which.

DESCRIPTION OF A PREFERRED EMBODIMENT

Figure 1:
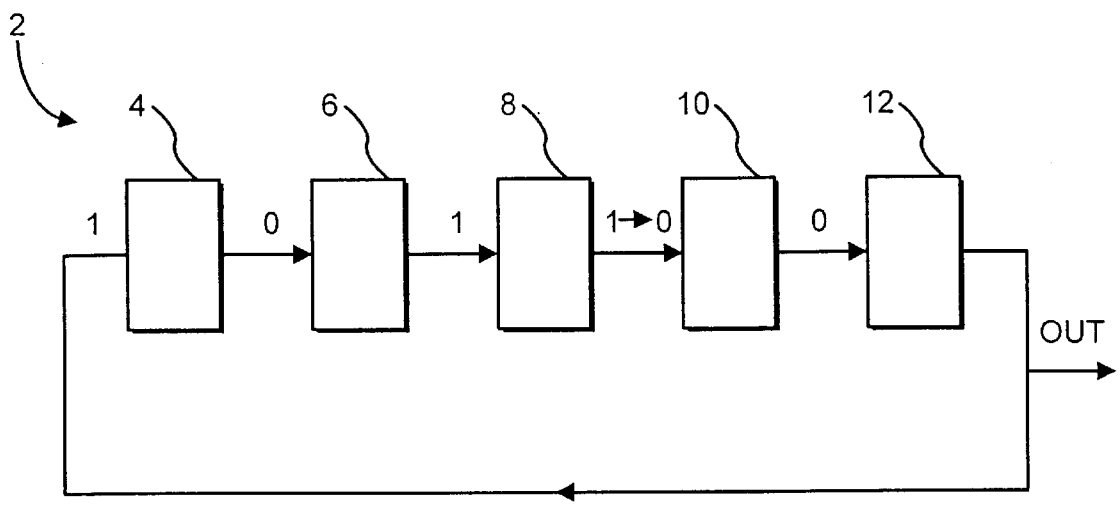
FIG. 1 schematically illustrates a ring oscillator.

FIG. 1 schematically illustrates a ring oscillator 2 having five oscillator stages 4, 6, 8, 10 and 12. The oscillator stages 4, 6, 8, 10 and 12 are arranged in a ring with the output of oscillator stage 12 being coupled to the input of oscillator stage 4. In this example each oscillator stage 4, 6, 8, 10 and 12 acts as an invertor serving to invert the signal presented to its input to generate its output. If the input to an oscillator stage 4, 6, 8, 10 and 12 changes, then the oscillator stage output signal will also change after a propagation delay time that is characteristic of the oscillator stage. Since the ring oscillator 2 has an odd number of oscillator stages 4, 6, 8, 10 and 12 with each stage being an invertor, there is no stable static set of oscillator stage output signals and instead a change of signal circulates around the ring oscillator 2. At the instant illustrated in FIG. 1, the input signal to oscillator stage 8 can be considered to have just changed to become a "1" and the oscillator stage 8 is responding by changing its output signal from being a "1" to being a "0". Once the output of oscillator stage 8 has made this change, then oscillator stage 10 will have a new input signal value and will in response change its output signal value. Thus, the ring oscillator 2 circulates a change of signal level with the frequency of chance of a given signal value within the ring being dependent upon the sum of the propagation delays through the oscillator stages 4, 6, 8, 10 and 12.

The embodiment shown in FIG. 1 has five oscillator stages 4, 6, 8, 10 and 12, but it will be appreciated that different numbers of oscillator stages are possible depending upon the frequency required and the nature of the oscillator stages.

Figure 2:
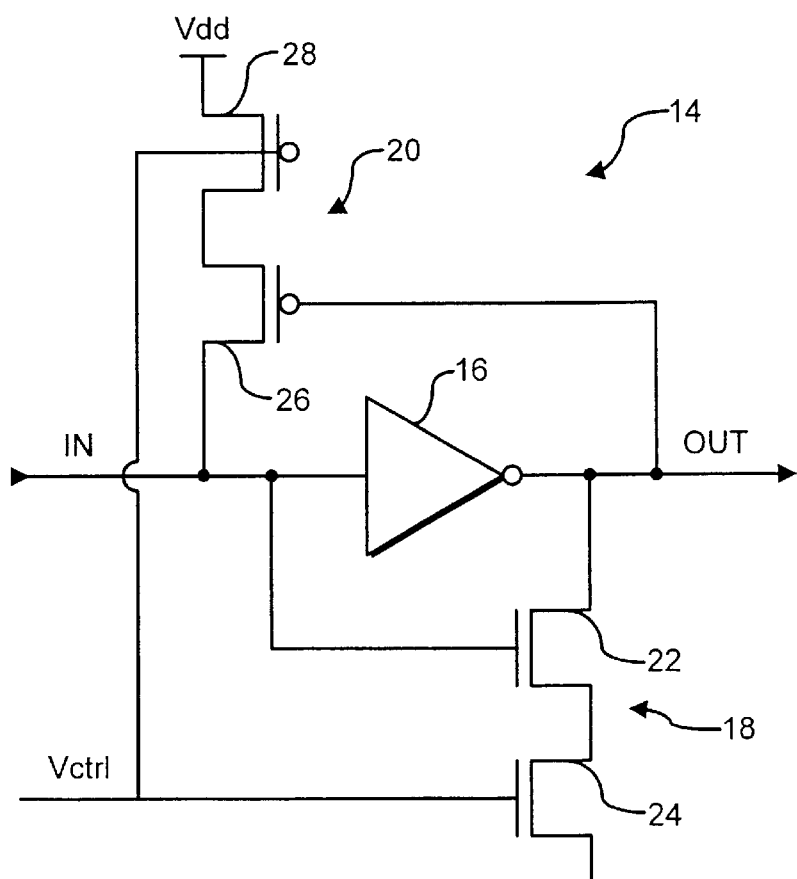
FIG. 2 schematically illustrates an oscillator stage.

It will be appreciated from the above that the oscillator output frequency of the ring oscillator 2 is dependent upon the propagation delay through the oscillator stages 4, 6, 8, 10 and 12. FIG. 2 schematically illustrates an oscillator stage 14 in more detail. The oscillator stage 14 includes an invertor 16 that receives an oscillator stage input signal "In" and inverts it to produce an oscillator stage output signal "Out" after a propagation delay. The size of the propagation delay depends upon how quickly the oscillator stage input signal "In" changes it level and how quickly the invertor 16 is able to drive its oscillator stage output signal "Out" to change its level. Absent any other factors, the rate at which the oscillator stage input signal "In" changes level will be controlled by the ability of the preceding oscillator stage to drive the change in its output signal load. Similarly, the rate at which the invertor 16 can drive its output signal "Out" to change will depend upon the strength of the transistors forming the invertor 16 and the load they are driving. Thus, the basic propagation delay through the oscillator stage 14 will be controlled by the characteristics of the invertor 16.

In order to adjust the propagation delay through the oscillator stage 14, a level change accelerating circuit 18 is provided to assist the change in oscillator stage output signal level being driven by the invertor 16. A level change decelerating circuit 20 is provided to resist changes in the oscillator stage input signal being driven by the preceding oscillator stage.

The level change accelerating circuit 18 comprises a stack of two NFETs 22 and 24 disposed between the invertor 16 output and the ground rail voltage. The NFET 22 is switched on by a high voltage and so a change in oscillator stage input signal "In" from a "0" to a "1" will switch on the NFET 22. The NFET 22 will assist in driving the oscillator stage output signal "Out" from a "1" to a "0" by providing a path to ground through the NFET 24. The gate of the NFET 24 receives the input control signal Vctrl that serves to adjust the oscillator frequency. Depending on the value of the input control signal Vctrl, the NFET 24 will pass current at differing rate and so allow the level change accelerating circuit 18 to shorten the propagation delay to a degree dependent upon the input control signal Vctrl.

The level change decelerating circuit 20 comprises a stack of two PFETs 26 and 28 disposed between the invertor 16 input and the Vdd rail voltage. The PFET 26 is switched on by a low voltage and so when the oscillator stage output signal "Out" changes from a "0" to a "1", the PFET 26 will initially be switched on. Thus, the PFET 26 will resist the driving of the oscillator stage input signal "In" from a "1" to a "0" by the preceding oscillator stage (the preceding oscillator stage will overpower the level change decelerating circuit 20) by providing a path to the Vdd rail voltage through the PFET 28. The gate of the PFET 28 receives the input control signal Vctrl that serves to adjust the oscillator frequency. Depending on the value of the input control signal Vctrl, the PFET 28 will pass current at differing rate and so allow the level change decelerating circuit 20 to lengthen the propagation delay to a degree dependent upon the input control signal Vctrl.

When the input control signal Vctrl is below the threshold voltage of the NFET 24 such that the level change accelerating circuit 18 is ineffective, the PFET 28 will be conductive and so the level change decelerating circuit 20 will be active in adjusting the oscillator frequency to a lower value (by decreasing the forward gain). Conversely, when the input control signal Vctrl is above the threshold voltage of the PFET 28 such that the level change decelerating circuit 20 is ineffective, the NFET 24 will be conductive and so the level change accelerating circuit 18 will be active in adjusting the oscillator frequency to a higher value (by increasing the forward gain). When the input control signal Vctrl is at intermediate values, the level change accelerating circuit 18 and level change decelerating circuit 20 will both be active to some degree and the overall propagation delay through the oscillator stage 14 will be controlled by their combined effect in combination with the invertors 16 of the current and preceding stages.

Figure 3A:
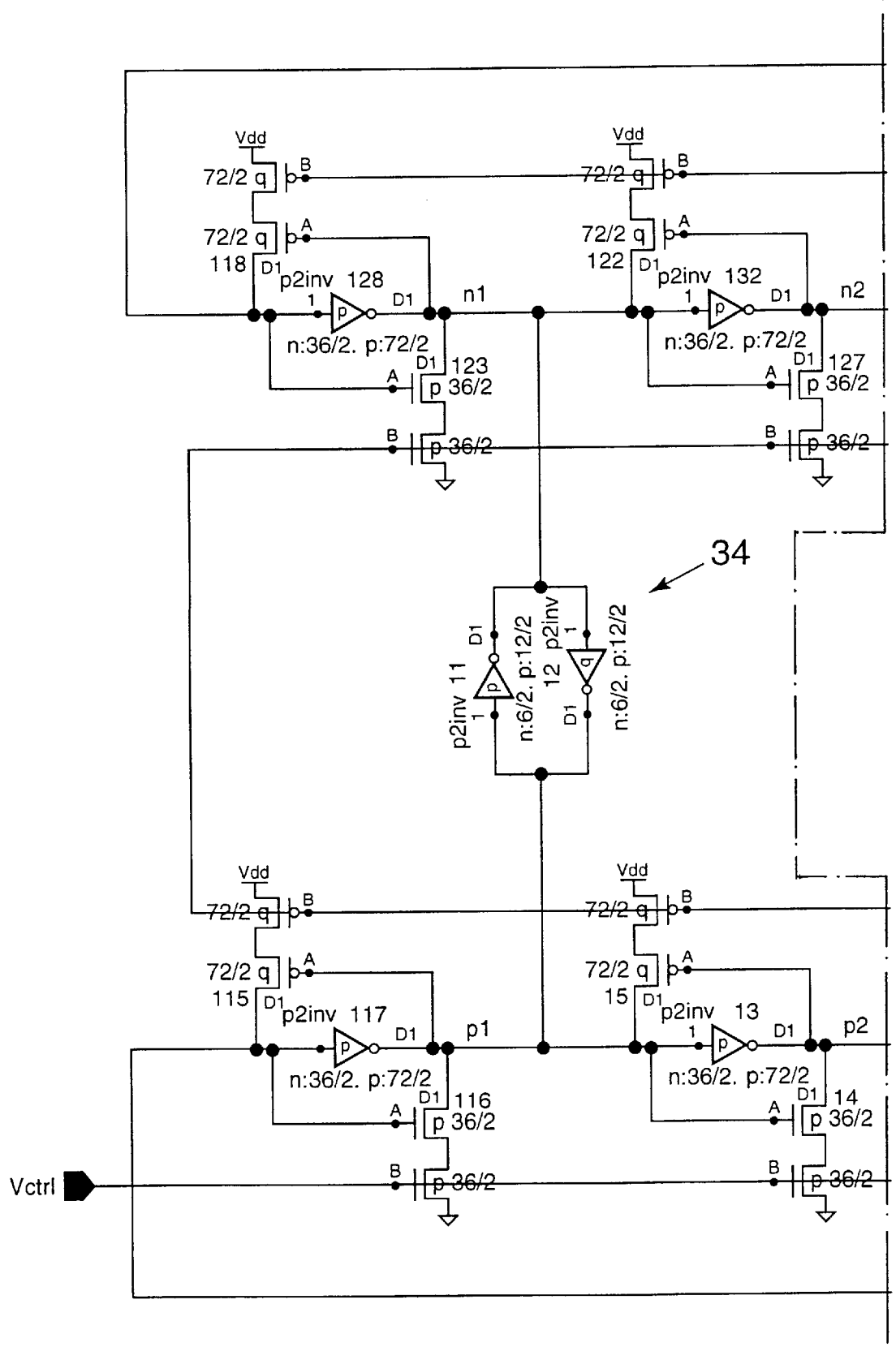
FIG. 3 schematically illustrates a voltage controlled oscillator.
Figure 3B:
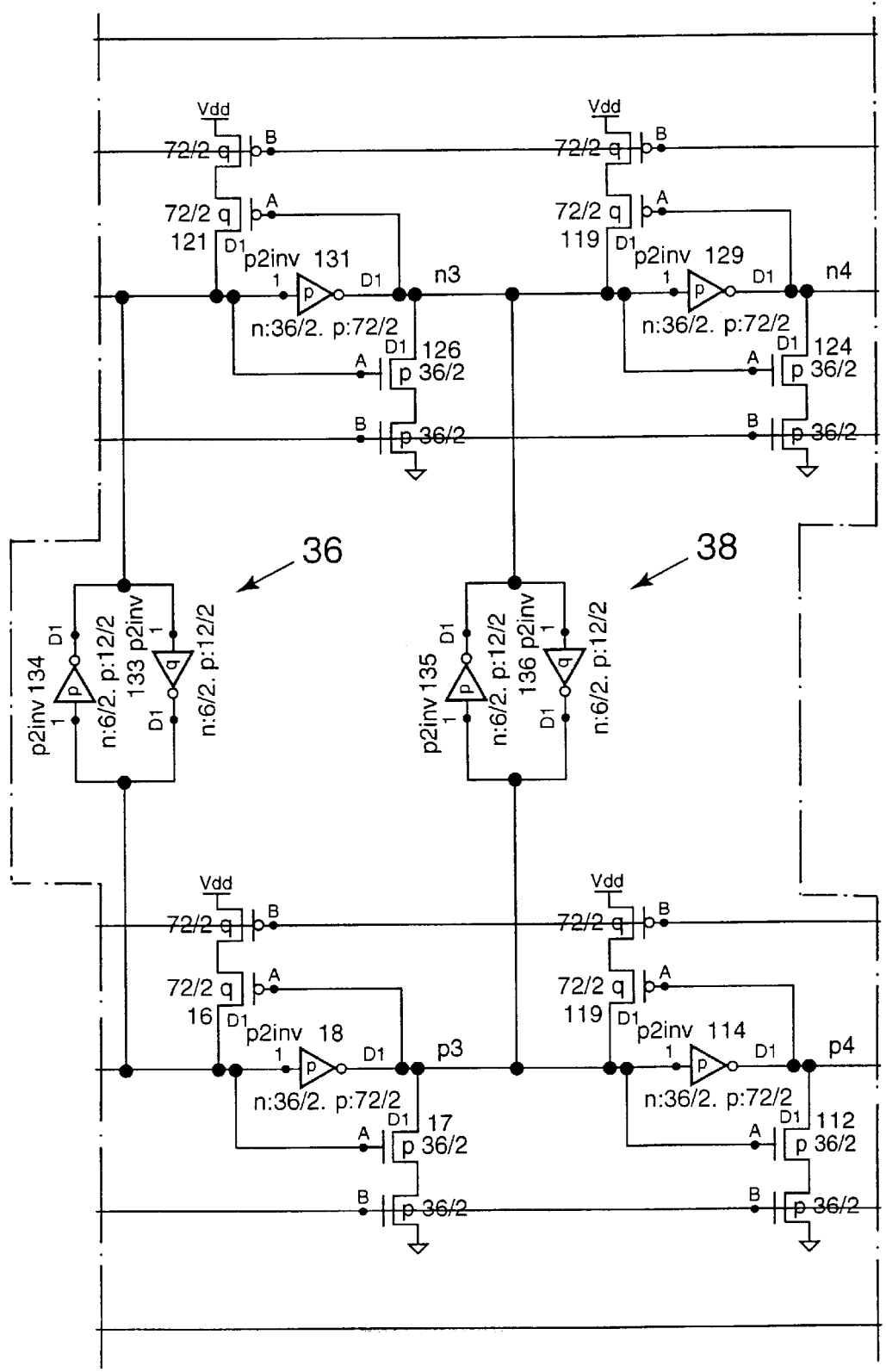
Figure 3C:
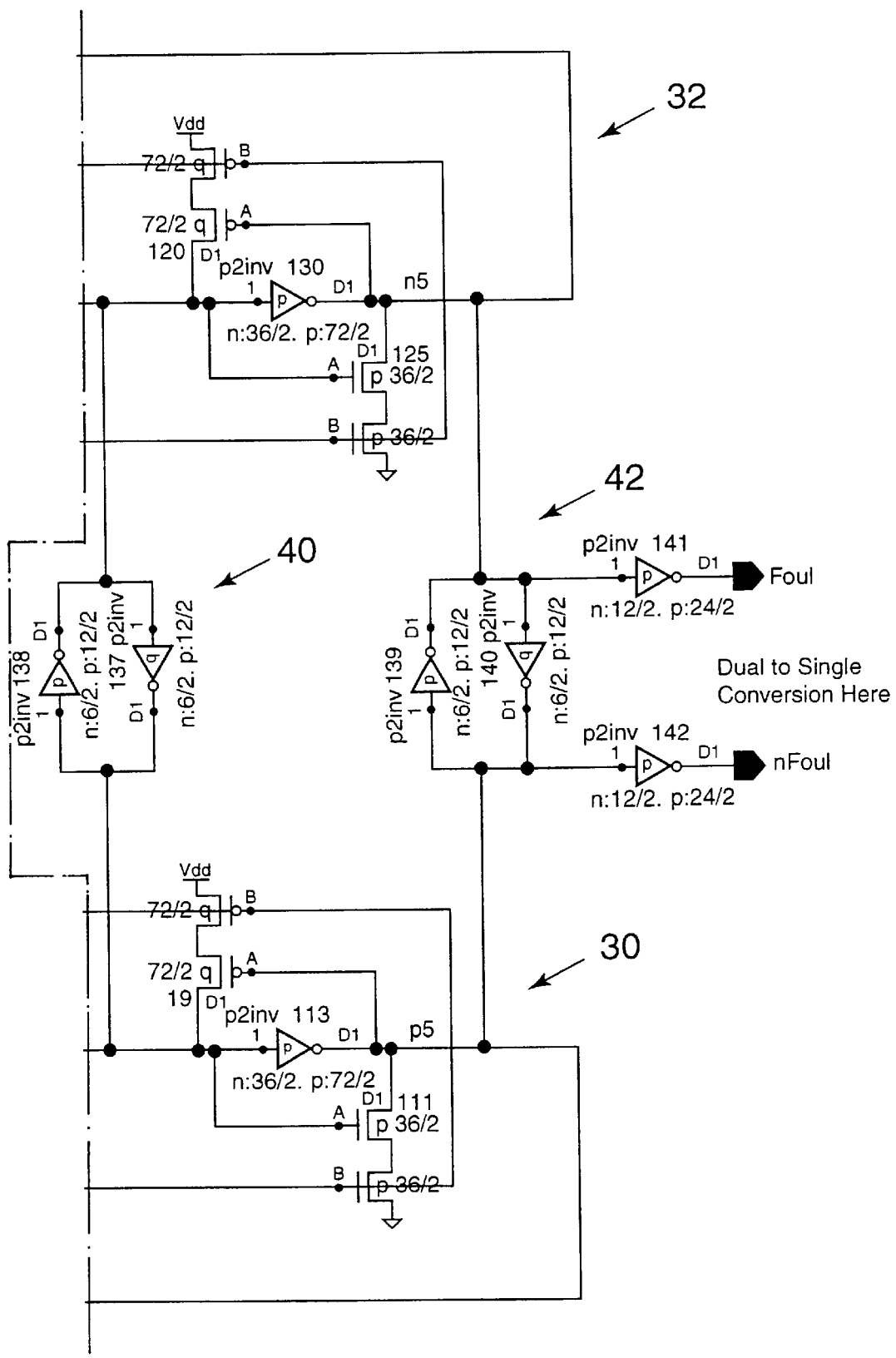

FIG. 3 illustrates a voltage controlled oscillator circuit having two ring oscillators 30 and 32. Each of the ring oscillators 30 and 32 is formed of five oscillator stages as illustrated in FIG. 2. Different numbers of oscillator stage would also be possible providing a signal making a complete pass through all the oscillator stages is inverted. The voltage controlled oscillator may be formed as part of an integrated circuit. The matching of the two ring oscillators 30 and 32 can be improved by forming their oscillator stages adjacent and/or interleaved to one another on the integrated circuit.

The two ring oscillators 30 and 32 are synchronised to operate 180 degrees out of phase with one another by parallel pairs of opposing invertors 34, 36, 38, 40 and 42 disposed between corresponding oscillator stage outputs. These pairs of opposing invertors 34, 36, 38, 40 and 42 act to urge the oscillator outputs signals of corresponding oscillator stages to change level the same time, i.e. as one signal changes from a "0" to a "1", the opposing invertors will seek to drive the other signal to change from a "1" to a "0" at the same time. Thus, the opposing invertors 34, 36, 38, 40 and 42 serve to lock the two ring oscillators 30 and 32 180 degrees out of phase with one another and also compensate to some degree for noise that may effect the operation of a single oscillator stage.

The oscillator output signal Fout can be taken from one side of the opposing invertor pair 42. The opposing invertor pairs 34, 36, 38, 40 and 42 also tend to force the oscillator output signal to a desirable 50% duty cycle without the need for double speed operation and edge triggering to achieve such a result.

It will seen that the voltage controlled oscillator described above are relatively low power consumption designs with no analog bias currents and relatively small FETs. The circuits are also relatively insensitive to the value of the threshold voltage for the transistors used allowing the circuit to be readily adapted to different manufacturing processes. When the circuit is formed on an integrated circuit to provide a clock signal to a digital circuit also formed on the integrated circuit, then as the speed of operation of the digital circuit is changed by manufacturing process parameters the clock signal circuit speed will also tend to change in the same way and so remain matched to the circuit it is driving. If adjustment to the oscillator frequency range is required, then this may be achieved relatively easily by changing the strength of the transistors in the level change accelerating circuit 18 and the level change decelerating circuit 20. The speed control in the above circuit is spread between several oscillator stages so reducing the sensitivity to noise at a single node. Power consumption can be reduced by only using one ring oscillator and removing the opposing invertor pairs. A differential version of the voltage controlled oscillator may be provided by swapping the positions of the NFET and PFET stacks 18 and 20 of FIG. 2.

Figure 4:
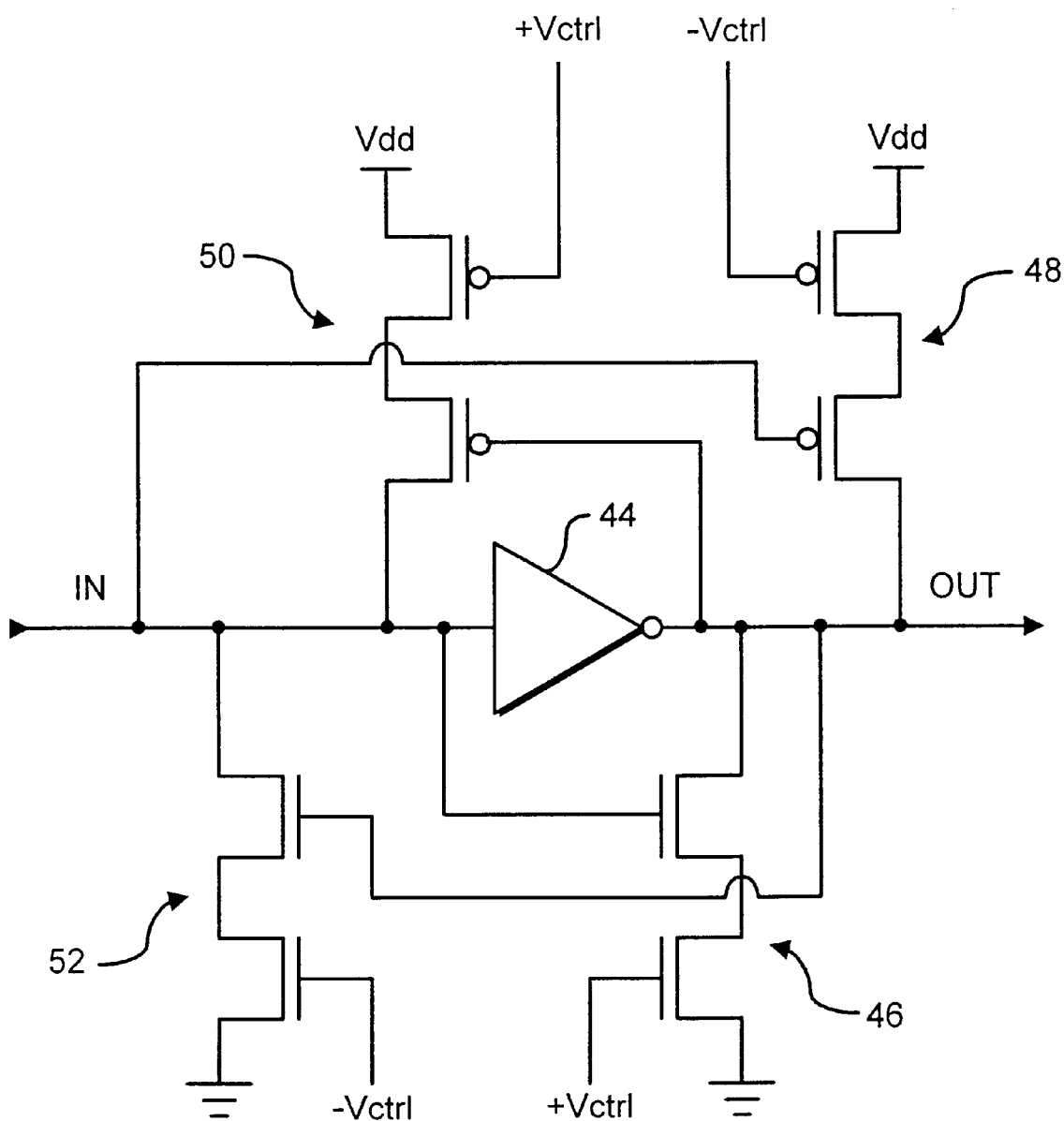
FIG. 4 schematically illustrates an alternative oscillator stage.

FIG. 4 schematically illustrates an alternative oscillator stage design. In this design the signal level change accelerating circuit is formed of the gate stacks 46 and 48 whilst the signal level change decelerating circuit is formed of the gate stacks 50 and 52. An invertor 44 is provided as the basic signal path through the oscillator stage. The input control signal +Vctrl and a logical inversion of the input control signal −Vctrl are used to control respective gate stacks. In this embodiment it is the difference between the signals +Vctrl and −Vctrl rather than the absolute value of Vctrl that controls the change in the propagattion delay time and so common mode noise rejection is improved.

The gate stack 46 speeds up, to a degree dependent upon +Vctrl, the rate at which the oscillator stage output signal "Out" is pulled to ground. The gate stack 48 speed ups, to a degree dependent upon −Vctrl, the rate at which the oscillator stage output signal "Out" is pulled to Vdd. The gate stack 50 slows down, to a degree dependent upon +Vctrl, the rate at which the oscillator stage input signal "In" is pulled to Vdd by the preceding oscillator stage. The gate stack 52 slows down, to a degree dependent upon −Vctrl, the rate at which the oscillator stage input signal "In" is pulled to ground by the preceding oscillator stage.

Although a particular embodiment of the invention has been described herewith, it will be apparent that the invention is not limited thereto, and that many modifications and additions may be made within the scope of the invention. In addition, various combinations of the features of the following dependent claims could be made with the features of the independent claims without departing from the spirit and scope of the present invention.

I claim:

1. A voltage controlled oscillator for generating an oscillator output signal with an oscillator output frequency controlled by an input control signal, said voltage controlled oscillator comprising:

a ring oscillator circuit having a plurality of oscillator stages linked in a ring with each oscillator stage generating a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage; wherein at least one of said oscillator stages includes:

(i) a signal level change accelerating circuit that acts to decrease said propagation delay time and increase said oscillator output frequency in response to a first change in said input control signal; and (ii) a signal level change decelerating circuit that acts to increase said propagation delay time and decrease said oscillator output frequency in response a second change in said input control signal, said first change and said second change being respective different ones of an increase in said input control signal and a decrease in said input control signal.

2. A voltage controlled oscillator as claimed in claim 1, wherein said at least one of said oscillator stages includes an invertor that generates said stage output signal by inverting said stage output signal of said preceding oscillator stage.

3. A voltage controlled oscillator as claimed in claim 2, wherein a first rail voltage signal having a first rail voltage signal level and a second rail voltage signal having a second rail voltage signal level are supplied to said voltage controlled oscillator, said first signal level and said second signal level being equal to respective ones of said first rail voltage signal level and said second rail voltage signal level.

4. A voltage controlled oscillator as claimed in claim 1, wherein said at least one oscillator stage drives said stage output signal to change from said first signal level to said second signal level, said signal level change accelerating circuit acts to accelerate said change, to a degree controlled by said input control voltage, by driving said stage output signal in a manner supporting said change from said first signal level to said second signal level.

5. A voltage controlled oscillator as claimed in claim 1, wherein said at least one oscillator stage drives said stage output signal to change from said first signal level to said second signal level, said signal level change decelerating circuit acts to decelerate said change, to a degree controlled by said input control signal, by driving said stage output signal of said preceding oscillator stage in said ring in a manner opposing said change from said first signal level to said second signal level.

6. A voltage controlled oscillator for generating an oscillator output signal with an oscillator output frequency controlled by an input control signal, said voltage controlled oscillator comprising:

a ring oscillator circuit having a plurality of oscillator stages linked in a ring with each oscillator stage generating a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage; wherein at least one of said oscillator stages includes:

(i) a signal level change accelerating circuit that acts to decrease said propagation delay time and increase said oscillator output frequency in response to a first change in said input control signal; and (ii) a signal level change decelerating circuit that acts to increase said propagation delay time and decrease said oscillator output frequency in response a second change in said input control signal, said first change and said second change being respective different ones of an increase in said input control signal and a decrease in said input control signal, wherein as said at least one oscillator stage drives said stage output signal to change from said first signal level to said second signal level, said signal level change accelerating circuit acts to accelerate said change, to a degree controlled by said input control voltage, by driving said stage output signal in a manner supporting said change from said first signal level to said second signal level, wherein said level change accelerating circuit comprises a first stack of gates having a first gate controlled by said stage output signal of said preceding oscillator stage in said ring and a second gate controlled by said input control signal.

7. A voltage controlled oscillator for generating an oscillator output signal with an oscillator output frequency controlled by an input control signal, said voltage controlled oscillator comprising:

a ring oscillator circuit having a plurality of oscillator stages linked in a ring with each oscillator stage generating a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage; wherein at least one of said oscillator stages includes:

(i) a signal level change accelerating circuit that acts to decrease said propagation delay time and increase said oscillator output frequency in response to a first change in said input control signal; and (ii) a signal level change decelerating circuit that acts to increase said propagation delay time and decrease said oscillator output frequency in response a second change in said input control signal, said first change and said second change being respective different ones of an increase in said input control signal and a decrease in said input control signal, wherein as said at least one oscillator stage drives said stage output signal to change from said first signal level to said second signal level, said signal level change decelerating circuit acts to decelerate said change, to a degree controlled by said input control signal, by driving said stage output signal of said preceding oscillator stage in said ring in a manner opposing said change from said first signal level to said second signal level, wherein said level change decelerating circuit comprises a first stack of gates having a first gate controlled by said stage output signal and a second gate controlled by said input control signal.

8. A voltage controlled oscillator as claimed in claim 1, wherein each of said oscillator stages includes a respective signal level change accelerating circuit and a respective signal level change decelerating circuit.

9. A voltage controlled oscillator for generating an oscillator output signal with an oscillator output frequency controlled by an input control signal, said voltage controlled oscillator comprising:

a ring oscillator circuit having a plurality of oscillator stages linked in a ring with each oscillator stage generating a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage; wherein at least one of said oscillator stages includes:

(i) a signal level change accelerating circuit that acts to decrease said propagation delay time and increase said oscillator output frequency in response to a first change in said input control signal; and (ii) a signal level change decelerating circuit that acts to increase said propagation delay time and decrease said oscillator output frequency in response a second change in said input control signal , said first change and said second change being respective different ones of an increase in said input control signal and a decrease in said input control signal, comprising two ring oscillators operating in a fixed phase relationship.

10. A voltage controlled oscillator as claimed in claim 9, wherein a change in stage output signal of at least one oscillator stage of a first of said two ring oscillators is synchronised with a change in stage output signal of an oscillator stage of a second of said two ring oscillators by a parallel pair of opposing invertors coupling said stage output signal of said at least one oscillator stage of said first of said two ring oscillators to said stage output signal of said oscillator stage of said second of said two ring oscillators.

11. A voltage controlled oscillator as claimed in claim 10, wherein said two ring oscillators have an equal number of oscillator stages and each stage output signal of an oscillator stage of said first ring oscillator is coupled to a stage output signal of an oscillator stage at a corresponding position with said second ring oscillator.

12. A voltage controlled oscillator as claimed in claim 11, wherein said voltage controlled oscillator is formed as an integrated circuit with corresponding stages of said two ring oscillators being formed one or more of adjacent to each other within said integrated circuit and interleaved with each other within said integrated circuit.

13. A voltage controlled oscillator as claimed in claim 6, wherein said level change accelerating circuit comprises a second stack of gates having a third gate controlled by said stage output signal of said preceding oscillator stage in said ring and a fourth gate controlled by a logical inversion of said input control signal.

14. A voltage controlled oscillator as claimed in claim 7, wherein said level change decelerating circuit comprises a second stack of gates having a third gate controlled by said stage output signal and a fourth gate controlled by a logical inversion of said input control signal.

15. A method of generating an oscillator output signal with an oscillator output frequency controlled by an input control signal using a voltage controlled oscillator, said method comprising the steps of:

generating, within each stage oscillator of a ring oscillator circuit having a plurality of oscillator stages linked in a ring, a stage output signal that changes state between a first signal level and a second signal level in response to a change in state of a stage output signal of a preceding oscillator stage in said ring, said change between said first signal level and said second signal level taking place a propagation delay time after said change in state of said stage output signal of said preceding oscillator stage;

decreasing said propagation delay time and so increasing said oscillator output frequency in response to a first change in said input control voltage signal using a signal level change accelerating circuit within at least one of said oscillator stages; and increasing said propagation delay time and so decreasing said oscillator output frequency in response to a second change in said input control voltage signal using a signal level change decelerating circuit within said at least one of said oscillator stages, said first change and said second change being respective different ones of an increase in said input control voltage and a decrease in said input control voltage.

\* \* \* \* \*